United States Patent
Asami

(10) Patent No.: US 6,700,904 B2
(45) Date of Patent: Mar. 2, 2004

(54) LIGHT SOURCE FOR AN EXTERNAL CAVITY LASER

(75) Inventor: Keisuke Asami, Kanagawa (JP)

(73) Assignee: Ando Electric Co., Ltd., Kanagawa (JP)

(*) Notice: Subject to any disclaimer, the term of this patent is extended or adjusted under 35 U.S.C. 154(b) by 0 days.

(21) Appl. No.: 09/817,927

(22) Filed: Mar. 27, 2001

(65) Prior Publication Data
US 2001/0026568 A1 Oct. 4, 2001

(30) Foreign Application Priority Data
Mar. 30, 2000 (JP) .................. P.2000-094212

(51) Int. Cl.$^7$ .................. H01S 3/10
(52) U.S. Cl. .................. 372/20; 372/43
(58) Field of Search .................. 372/8, 15, 29.1, 372/102, 43, 49, 20

(56) References Cited

U.S. PATENT DOCUMENTS

| | | | | |
|---|---|---|---|---|
| 3,943,462 A | * | 3/1976 | Thompson | 372/49 |
| 4,306,778 A | * | 12/1981 | Wada et al. | 351/211 |
| 4,720,834 A | * | 1/1988 | Yamamoto et al. | 372/45 |
| 4,731,792 A | * | 3/1988 | Shimizu et al. | 372/49 |
| 4,839,901 A | * | 6/1989 | Mozer et al. | 372/49 |
| 4,951,292 A | * | 8/1990 | Kuindersma et al. | 372/49 |
| 5,140,599 A | * | 8/1992 | Trutna et al. | 372/102 |
| 5,434,874 A | * | 7/1995 | Fouquet et al. | 372/20 |
| 5,442,651 A | * | 8/1995 | Maeda | 372/97 |
| 5,491,714 A | * | 2/1996 | Kitamura | 372/92 |
| 5,493,575 A | * | 2/1996 | Kitamura | 372/20 |
| 5,548,609 A | * | 8/1996 | Kitamura | 372/100 |
| 5,559,816 A | * | 9/1996 | Basting et al. | 372/102 |
| 5,784,507 A | | 7/1998 | Holm-Kennedy et al. | |
| 5,862,162 A | * | 1/1999 | Maeda | 372/20 |
| 5,872,655 A | | 2/1999 | Seddon et al. | |
| 6,141,360 A | * | 10/2000 | Kinugawa et al. | 372/20 |

FOREIGN PATENT DOCUMENTS

| | | |
|---|---|---|
| EP | 0 647 995 A1 | 4/1995 |
| EP | 0 907 229 A2 | 4/1999 |
| EP | 0 911 924 A2 | 4/1999 |
| EP | 0 920 094 A1 | 6/1999 |
| EP | 0 921 614 A1 | 6/1999 |
| EP | 0 952 643 A2 | 10/1999 |
| JP | 11-126943 | 5/1999 |

OTHER PUBLICATIONS

Patent Abstracts of Japan, JP 56 090642 A, "Optical Communication System," vol. 005, No. 163 (E–078), Oct. 20, 1981.

Boshier et al., "External–cavity frequency–stabilization of visible and infrared semiconductor lasers for high resolution spectroscopy," Optics Communications 85:355–359, 1991.

Liu and Littman, "Novel geometry for single–mode scanning of tunable lasers," Optics Letters 6(3):117–118, XP–000710138, 1981.

* cited by examiner

*Primary Examiner*—Paul Ip
*Assistant Examiner*—Tuan Nguyen
(74) *Attorney, Agent, or Firm*—Fish & Richardson P.C.

(57) ABSTRACT

A light source for an external cavity laser comprises a semiconductor laser 1 having a first facet to which is applied an antireflection coating 1A and a second facet to which is applied a increased reflection coating 1B defining a predetermined reflectivity, lenses 5, 6, a diffraction grating 2, and a mirror 3, wherein a light emitted from the first facet is converted into a parallel light by the lens 5, and the parallel light passes through the diffraction grating 2 to select a wavelength and is reflected to the diffraction grating 2 by the mirror 3 to select a wavelength via the diffraction grating 2 again, and the parallel light is converged by the lens 5 to be fed back to the semiconductor laser 1, and a light emitted from the second facets is converged by the lens 7 to be output to an optical fiber 4.

7 Claims, 7 Drawing Sheets

LIGHT SOURCE FOR AN EXTERNAL CAVITY LASER

BACKGROUND OF THE INVENTION

1. Field of the Invention

This invention relates to a light source for an external cavity laser to be used in the field of optical communication.

2. Description of the Related Art

A light source for an external cavity laser in the related art will be described below with reference to FIGS. 8 to 11.

As shown in FIG. 8, in the light source for an external cavity laser of the related art, an antireflection coating 15A is applied onto one facet of a semiconductor laser 15. A light beam emitted from the facet of the antireflection coating 15A side is converted into a parallel light beam by a lens 5. Wavelength selection of the parallel light beam is performed by a diffraction grating 2. Subsequently, the light beam is returned to the diffraction grating 2 by a mirror 3 to perform wavelength selection again by the diffraction grating 2 and to feed back the light beam to the semiconductor laser 15 to perform laser oscillation.

With regard to the output light beam, the light beam emitted from the other facet of the semiconductor laser 15 is converted into a parallel light beam by lens 6. After passage through an optical isolator 8, the light beam is converged by lens 7 into an optical fiber 4 to be taken out.

The system illustrated in FIG. 8 is called a Rittman type, and since wavelength selection is performed twice by the diffraction grating 2 in the round-trip, it is excellent in wavelength selectivity and is presently known as the most general type of system.

With the arrangement shown in FIG. 9, a beam splitter 9, which takes out a part of the diffracted light beam that is fed back from the diffraction grating 2 to semiconductor laser 15, is equipped between the semiconductor laser 15 and the diffraction grating 2 of the light source for an external cavity laser of FIG. 8, and the diffracted light beam 10 that is taken out by beam splitter 9 is converged and output into optical fiber 11 via an optical isolator 12 and a lens 13. Since the diffracted light 10 is the light that has just undergone the wavelength selection twice by the diffraction grating 2 in the round-trip, though the optical output will be somewhat lower in comparison to the output of the optical fiber 4, an extremely pure single-wavelength light beam, which does not contain any of the spontaneous emission components that emitted from semiconductor laser 15, can be obtained (refer to Japanese Unexamined Patent Publication No.Hei.11-126943).

Meanwhile, FIG. 10 shows an example where a band-pass filter 14 is used in place of the diffraction grating of the light source for an external cavity laser of FIG. 8.

In a light source for an external cavity laser, such as those shown in FIGS. 8 to 10, though the antireflection coating 15A that is applied to one facet of the semiconductor laser 15 is essential for forming the external resonator, the other facet is not provided in particular with a coating due to reasons of cost and is left in the form of a cleavage plane (the surface as it is when the element is cleaved; the reflectivity is approximately 32%), as in a general Fabry-Perot laser.

FIGS. 11 and 12 show examples where a total reflection coating 16B, with a reflectivity of substantially 100%, is applied to one facet of a semiconductor laser 16 at the side on which an antireflection coating 16A is not applied in order to increase the optical output of the optical fiber 4 or the optical fiber 11 of the examples of the related art in FIG. 8 or 9 as much as possible.

In the example shown in FIG. 12, since the total reflection coating 16B is used at one facet of the semiconductor laser 16, the output light beam is obtained as the 0th-order light of the diffraction grating 2.

Normally in a light source for an external cavity laser, when the efficiency of the resonator drops below that of a Fabry-Perot laser diode, with which both facets are cleavage planes, the optical resonance itself weakens and the laser emission conditions tend to become unstable.

As a most simple indicator for the efficiency of the resonator, the product of the reflectivities of both facets of the resonator may be compared (in the case of an external resonator, the product of the reflectivity of the facet at one side and the feedback efficiency of the external oscillator). In a Fabry-Perot laser diode, since both facets are cleavage planes and the reflectivity of each of the facets is approximately 32% in the case of an element with an emission wavelength of 1550 nm, the product will be:

$$0.32 \times 0.32 \approx 0.1$$

In the case of the external resonator type semiconductor laser light source, an antireflection coating is normally applied to one facet of the semiconductor laser, and the other facet of the semiconductor laser is a cleavage plane. In the case of an element for 1550 nm, this cleavage plane is a partially reflecting surface with a reflectivity of approximately 32%. Thus in an external resonator, the semiconductor laser will not undergo emission by itself and laser emission occurs as a result of the feedback of light. The feedback efficiency thus corresponds to the reflectivity of the other facet.

In case of the example shown in FIG. 8, if the coupling efficiency of the lens 5 is 50%, the diffraction efficiency of the diffraction grating 2 is 80%, and the reflectivity of the mirror 3 is 95%, thus:

$$\text{Feedback efficiency} \approx 0.5 \times (0.8 \times 0.8) \times 0.95 \times 100 = 30.4\%$$

It is found that the feedback efficiency is thus lowered to approximately 30%.

Since the product of the reflectivities of both facets of the resonator is thus:

$$0.32 \times 0.304 \approx 0.097$$

It can be understood that the efficiency of the resonator is lowered and the emission condition tends to be unstable.

In the example of FIG. 8, since the light beam is made to undergo spectral separation twice by the diffraction grating in the round-trip in order to increase the wavelength selectivity, even if the diffraction efficiency is 80%, the efficiency is lowered to 64% in the round-trip. Accordingly, it is difficult to increase the feedback efficiency using the system of FIG. 8.

Furthermore, in the light source for an external cavity laser of FIG. 9, since the beam splitter 9 is provided between the semiconductor laser 15 and the diffraction grating 2, the light beam passes through the beam splitter 9 twice in addition to being diffracted by the diffraction grating 2 in the round-trip. Thus if the splitting efficiency of the beam splitter is given as 80% transmittance and 20% reflectance, the feedback efficiency is:

$$0.5 \times (0.8 \times 0.8) \times (0.8 \times 0.8) \times 0.95 \times 100 = 19.5\%$$

Thus, the feed back efficiency is lowered to approximately 20%.

Likewise, the product of the reflectivities of the facets of the resonator is:

0.32×0.195≈0.06

Though it is desirable here to improve the coupling efficiency of the lens part, which is considered to be highest in loss, since the emission NA of the semiconductor laser takes on a large value of 0.4 to 0.5 and a cross-sectional area (emission area) of the active layer is only a few μm, that is extremely small, it is difficult to achieve significant improvements even when an aspherical lens having low aberration, etc. is used.

As shown in FIG. 10, the same applies in case where band-pass filter 14 is used. That is, since a band-pass filter 14, that is narrow in half-width and excellent in wavelength selectivity, is generally high in transmission loss and the feedback efficiency thus tends to be low, it is also difficult to obtain stable oscillation conditions.

Also in the examples shown in FIGS. 11 and 12, though the optical output of the optical fiber 4 or the optical fiber 11 may be increased as much as possible by the application of the total-reflection coating 16B, since oscillation tends to occur readily even with a slight reflection at the facet on which antireflection coating 16A is applied, a composite resonator tends to be constructed, and thus it is difficult to achieve stable emission without multi-modes and mode hopping as the light source for an external cavity laser (this is especially significant in the case of a variable wavelength light source)

SUMMARY OF THE INVENTION

An object of the invention is to restrain unstable oscillation, such as multi-mode emission and mode hopping, and stabilize emission conditions in a light source for an external cavity laser even when the efficiency of feedback of light to the semiconductor laser is lowered by the loss due to various optical elements.

In order to achieve the above object, according to a first aspect of the invention, there is provided a light source for an external cavity laser, for example as shown in FIG. 1, which comprises a semiconductor laser 1, having an antireflection coating 1A provided on one end face thereof, and the light source for an external cavity laser converts a light beam emitted from the end face at the antireflection coating 1A side of the abovementioned semiconductor laser 1 into a parallel light beams, performs wavelength selection of the light beam by means of a wavelength selection optical element 2, then returns the light beam back to the wavelength selection optical element 2 by means of a mirror 3, then feeds back the light to the abovementioned semiconductor laser 1 upon performing wavelength selection again by means of the wavelength selection optical element 2, and converges and outputs a light beam emitted from the other end face of the abovementioned semiconductor laser 1 into an optical fiber 4, wherein a light source for an external cavity laser is characterized in that an increased reflection coating 1B, having prescribed reflectivity characteristics, is applied onto the end face of the abovementioned semiconductor laser 1 at the side on which antireflection coating 1A is not provided.

According to the first aspect of the invention, since the light source for an external cavity laser has an increased reflection coating, which has prescribed reflectivity characteristics, applied onto the end face of the semiconductor laser at the side on which the antireflection coating is not applied, even when the efficiency of feedback to the semiconductor laser is lowered by the passage of the light via the wavelength selection optical elements twice in the round-trip, a stable light source can be provided with which the occurrence of unstable emission, such as multi-mode emission and mode hopping, is restrained.

The light source for an external cavity laser may include a diffraction grating 2 that is used as the abovementioned wavelength selection optical element.

The light source for an external cavity laser may includes a beam splitter 9, which takes out a part of the diffracted light that is fed back from the diffraction grating 2 to the abovementioned semiconductor laser 1, between semiconductor laser 1 and diffraction grating 2, wherein the diffracted light beam that is taken out by the abovementioned beam splitter 9 is converged and output into an optical fiber 11.

In the invention, since the diffracted light beam is converged and output into the optical fiber, an extremely pure single-wavelength light beam, which does not contain any spontaneous emission components, can be obtained, and since an increased reflection coating is applied, a light source of stable emission conditions can be obtained even when the efficiency of feedback to the semiconductor laser is lowered to a level less than or equal to the first aspect of the invention due to the passage of light through the beam splitter and via the diffraction grating twice in the round-trip.

The light source for an external cavity laser may be equipped with a rotation mechanism (indicated by the arrow) that enables variation of the selected wavelength by the changing of the angle of the abovementioned mirror 3.

Since a rotation mechanism is equipped that enables variation of the selected wavelength by the changing of the angle of the mirror, the merit that an arbitrary wavelength can be selected freely is provided.

In the light source for an external cavity laser, a band-pass filter 14 may be used as the abovementioned wavelength selection optical element.

A beam splitter 9, which takes out a part of the diffracted light beam that is fed back from band-pass filter 14 to the abovementioned semiconductor laser 1, may be provided between semiconductor laser 1 and band-pass filter 14 and the diffracted light beam that is taken out by the abovementioned beam splitter 9 may be converged and output into an optical fiber 11.

Since the diffracted light beam, which is taken out by the beam splitter that takes out a part of the diffracted light that is fed back from the band-pass filter to the semiconductor laser, is converged and output into an optical fiber, an extremely pure single-wavelength light, which does not contain any spontaneous emission components, can be obtained, and since an increased reflection coating is applied, a light source of stable emission conditions can be obtained even when the efficiency of feedback to the semiconductor laser is lowered to a level less than or equal to that of the first aspect of the invention due to the passage of light through the beam splitter and the band-pass filter twice in the round-trip.

A partially reflecting mirror 17 may be used as the abovementioned mirror, and a part of the light beam that is fed back to the abovementioned semiconductor laser may be converged and output into an optical fiber 11.

Since the mirror is made a partially reflecting mirror and a part of the light beam that is fed back to the semiconductor laser is transmitted and then converged and output into an optical fiber, an extremely pure single-wavelength light beam, which is low in spontaneous emission components, can be obtained, and since an increased reflection coating is applied, a light source of stable emission conditions can be obtained even when the efficiency of feedback to the semiconductor laser is lowered.

The abovementioned band-pass filer 14 may be a variable band-pass filter with which the film thickness is varied in a continuous manner and a slide mechanism (indicated by the arrow) may be equipped for enabling the variation of the selected wavelength by the changing of the position of the abovementioned variable band-pass filter 14.

Since a slide mechanism is equipped for varying the selected wavelength by the changing of the position of a variable band-pass filter, with which the film thickness is varied in a continuous manner, an arbitrary wavelength can be selected freely.

DETAILED DESCRIPTION OF THE PRESENT INVENTION

Figure 1:
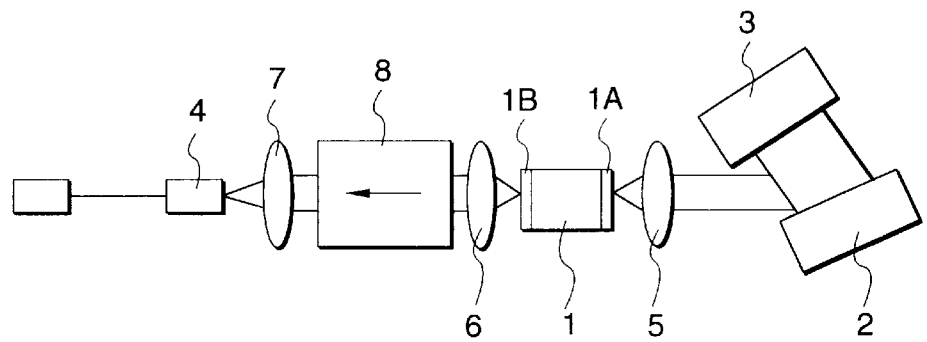
FIG. 1 is a constructional view showing an arrangement of an embodiment to which the invention is applied and shows a light source for an external cavity laser according to a first embodiment.

The present invention will now be described in detail with reference to the drawings.
First Embodiment As shown in an arrangement of FIG. 1, which is based on the related-art example of FIG. 8, a light source for an external cavity laser comprises a semiconductor laser 1, a diffraction grating 2, a mirror 3, an optical fiber 4, lenses 5, 6, and 7, a optical isolator 8, etc.

An antireflection coating 1A is applied to one facet of semiconductor laser 1.

A light beam emitted from the facet of semiconductor laser 1 at the antireflection coating 1A side is converted into a parallel light beam by the lens 5 and incidents on the diffraction grating 2. The parallel light beam that incidents on the diffraction grating 2 undergoes spectral separation according to wavelength in a radial manner and then incidents on the mirror 3. A light beam having a wavelength to incident perpendicularly on a reflecting surface of the mirror 3 out of the parallel light beam, which has undergone spectral separation by a diffraction grating 2, incidents on the diffraction grating 2 again and is fed back to the semiconductor laser 1 along the original light path upon undergoing spectral separation again.

A light beam emitted from the other facet of the semiconductor laser 1 is converted into a parallel light beam by means of the lens 6, transmitted through the optical isolator 8, and then converged onto the optical fiber 4 by the lens 7. Whereby lasing the output light beam is take out.

Normally, an incident facet of the optical fiber 4 is polished at an angle of 6 to 8° in order to restrain the reflection, and an antireflection coating is applied if necessary.

With regard to the semiconductor laser 1, although the facet at the side at which the output light is emitted is normally a cleavage plane (with a reflectivity of approximately 32%), in this embodiment, an increased reflection coating 1B is applied as shown in FIG. 1 in order to increase the reflectivity further to approximately 40%.

A supplementary description of the increased reflection coating 1B will be given.

The increased reflection coating 1B is a reflection coating that is aimed at increasing the reflectivity of the cleaved facet of the semiconductor laser 1 to some degree and differs from a total reflection coating that has the reflectivity of substantially 100%.

Normally, the reflectivity of the increased reflection coating 1B is preferably approximately 40 to 70%. Normally with such the increased reflection coating 1B, the desired reflectivity can be obtained readily by means of a dielectric multilayer coating.

In case where the feedback efficiency of an external oscillator is slightly lower than the reflectivity of the cleaved facet, namely the feedback efficiency is about 30%, specifically within 25–32%, the reflectivity of the increased reflection coating 1B is preferably one that slightly increases the reflectivity (approximately 40%). On the other hand, in case where the feedback efficiency of only about half the reflectivity of the cleaved facet is obtained, namely the feedback efficiency is about 20%, specifically within 15–25%, the reflectivity of the increased reflection coating 1B is preferably approximately 50 to 70%.

Figure 11:
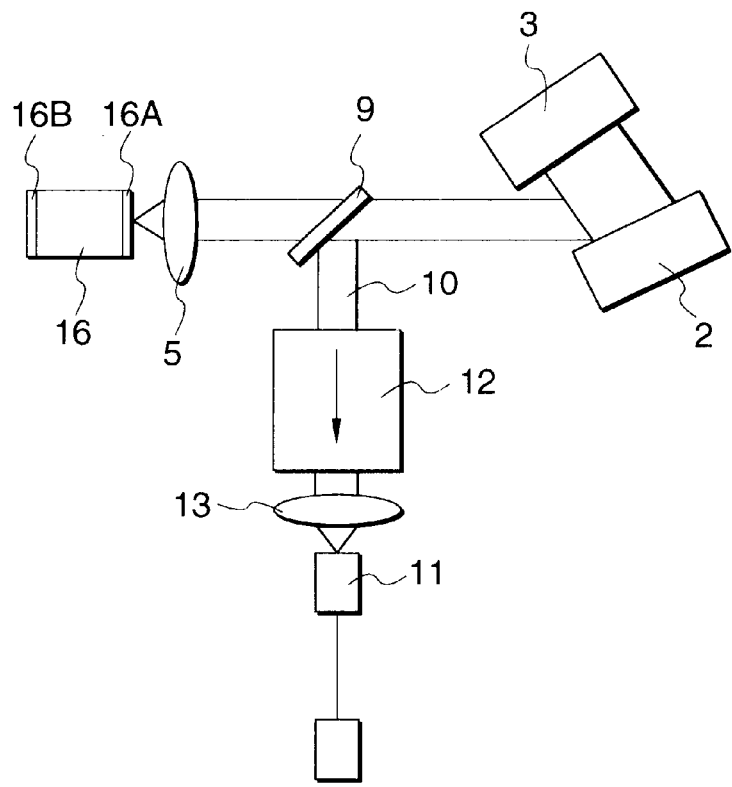
FIG. 11 is a constructional view showing another example of a related-art light source for an external cavity laser.
Figure 12:
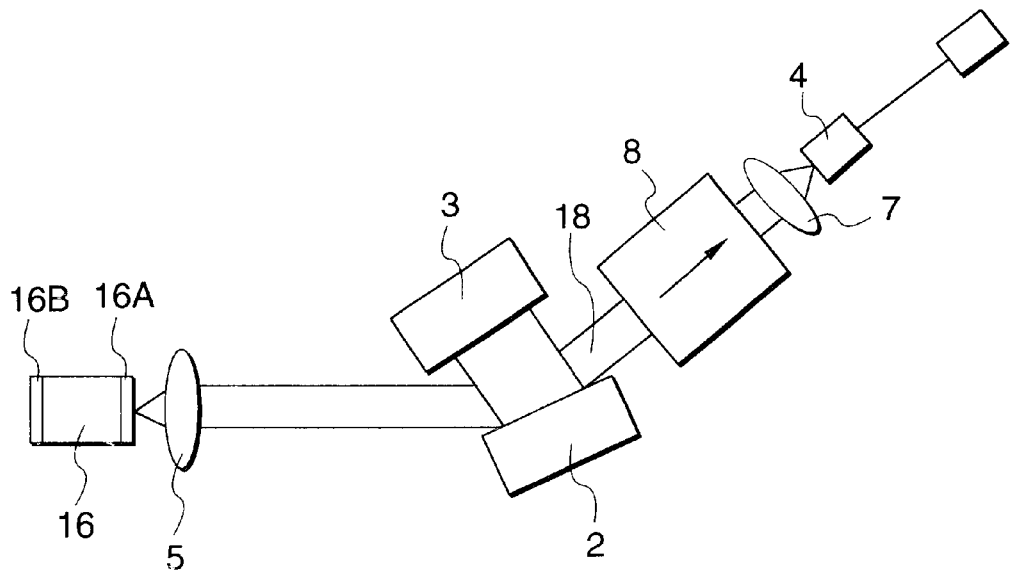
FIG. 12 is a constructional view showing another example of a related-art light source for an external cavity laser.

If the reflectivity of the increased reflection coating 1B is raised more than necessary, since Fabry-Perot oscillation will tend to occur (periodic power ripple arising according to wavelength becomes high) even with a very slight reflection at the facet of the semiconductor laser 1 on which the antireflection coating 1A is applied as in the related-art examples of FIGS. 11 and 12, a composite resonator will be formed wherein resonation occurs at the semiconductor laser 1 itself as well as at the external resonator. Accordingly, an oscillation condition thus becomes unstable, and therefore increasing the reflectivity more than necessary is not effective.

Consequently, the reflectivity of the increased reflection coating 1B is preferably set to a relatively low value within the required range.

A description of the embodiment of FIG. 1 will be continued.

For the light source for an external cavity laser of FIG. 1, the product of the reflectivities of the facets of the resonator, as determined in the same manner in the related-art examples, is:

$$0.4 \times 0.304 \approx 0.12$$

Figure 8:
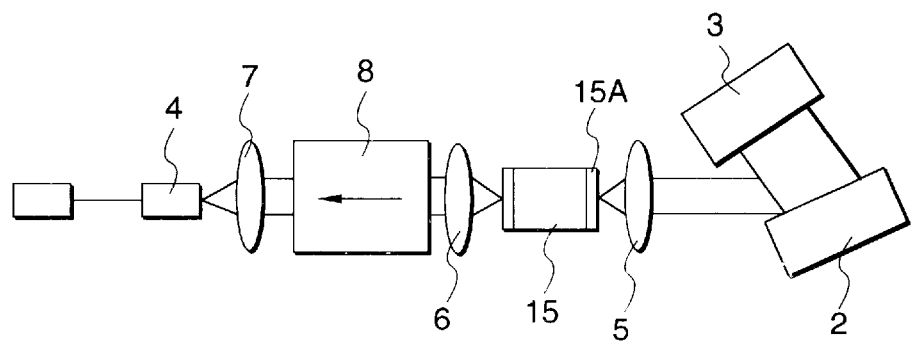
FIG. 8 is a constructional view showing an example of a related-art light source for an external cavity laser.

The efficiency of the resonator is thus improved in comparison to the value of 0.097 for the arrangement of FIG. 8 that is not provided with the increased reflection coating 1B.

Second Embodiment

Figure 2:
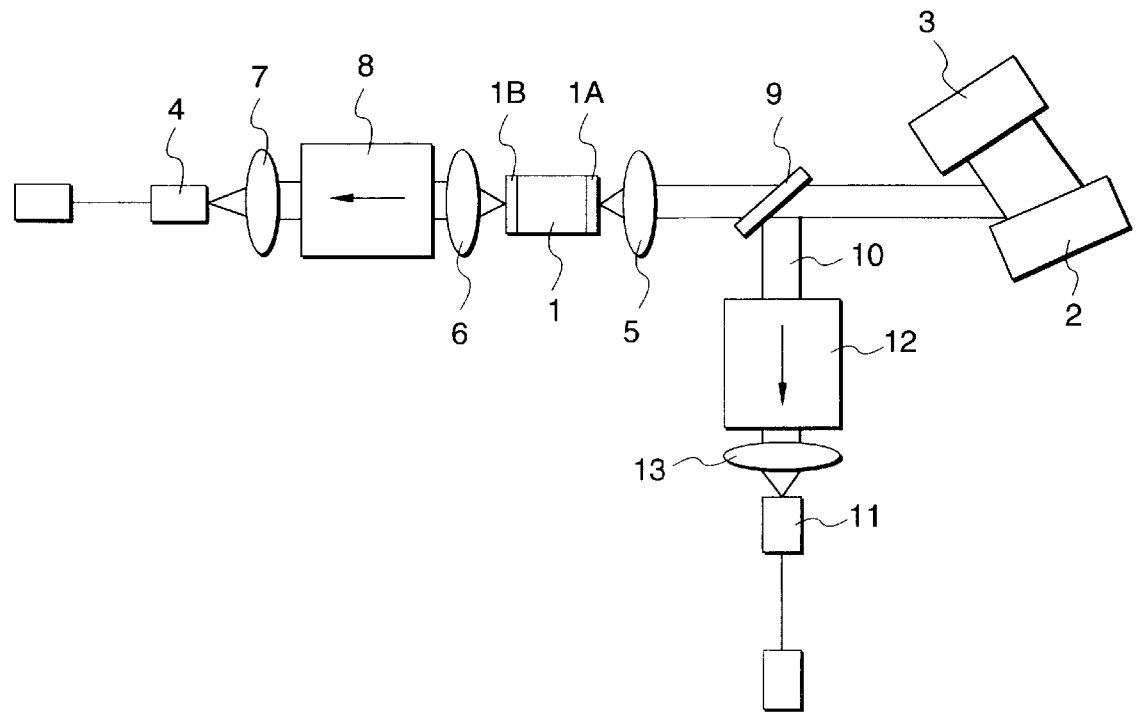
FIG. 2 is a constructional view showing a light source for an external cavity laser according to a second embodiment
Figure 9:
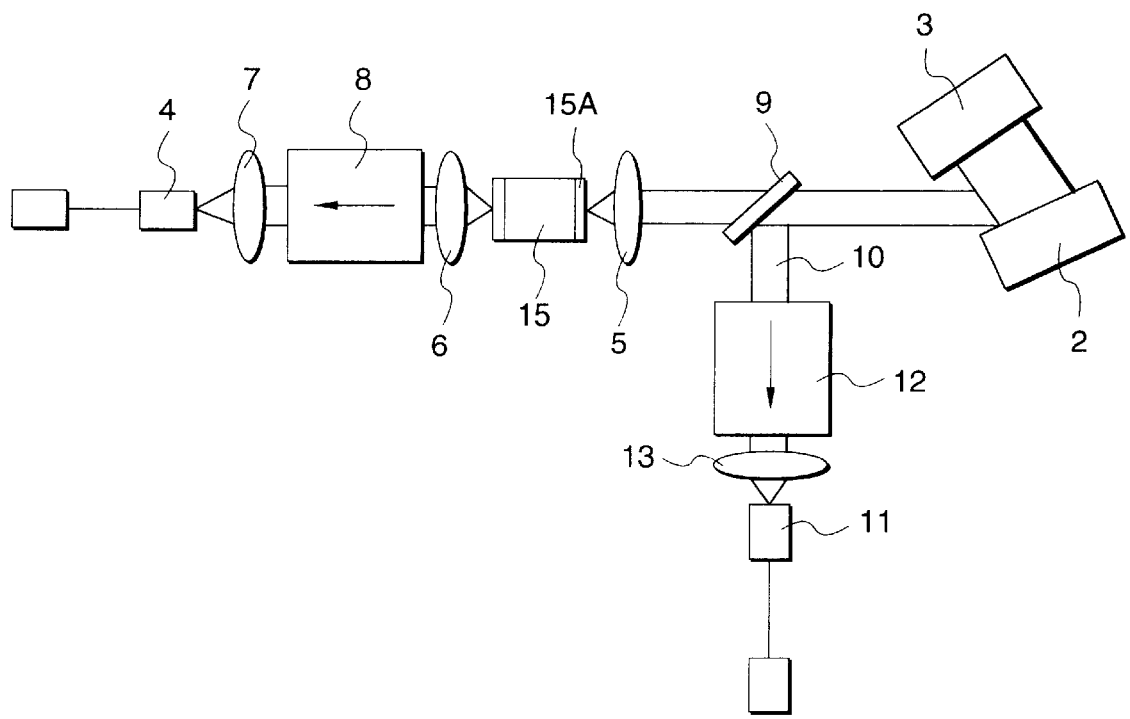
FIG. 9 is a constructional view showing another example of a related-art light source for an external cavity laser.
Figure 10:
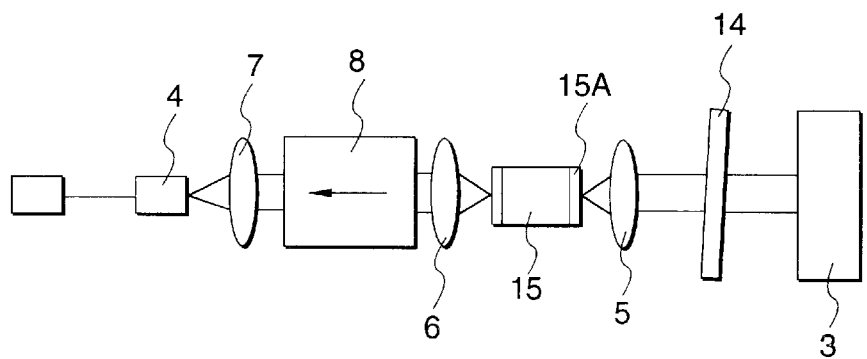
FIG. 10 is a constructional view showing another example of a related-art light source for an external cavity laser.

An arrangement shown in FIG. 2 is based on the related-art example of FIG. 9.

In the embodiment shown in FIG. 2, the reflectivity of an increased reflection coating 1B is set to approximately 52%. The product of the reflectivities of the facets of the resonator is:

$$0.52 \times 0.195 \approx 1.01$$

The efficiency of the resonator is thus improved in comparison to the value of 0.06 for the arrangement of FIG. 9 that is not provided with the increased reflection coating 1B.

Thus by providing the antireflection coating 1B, the efficiency of the resonator can be prevented from lowering even if the feedback efficiency is lowered and stable oscillation conditions without multi-mode oscillation or mode hopping can be obtained.

Third Embodiment

Figure 3:
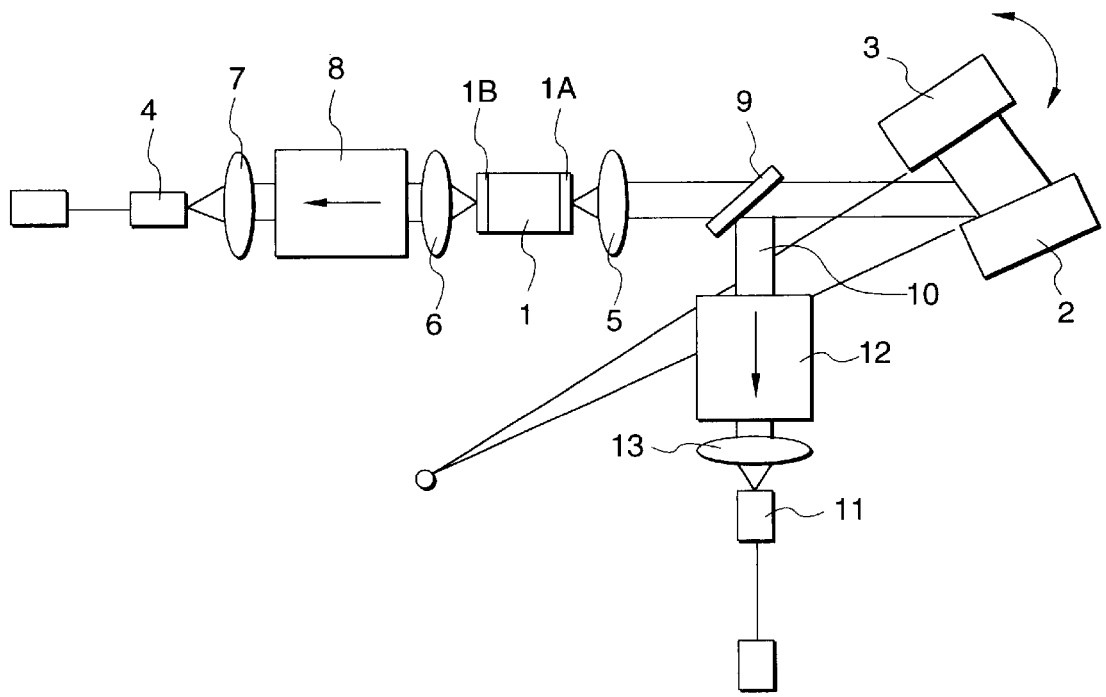
FIG. 3 is a constructional view showing a light source for an external cavity laser according to a third embodiment.

In a third embodiment of FIG. 3, the light source for an external cavity laser of FIG. 2 is provided with a rotation mechanism (indicated by the arrow) for varying selected wavelength according to an angle of a mirror 3.

Figure 13:
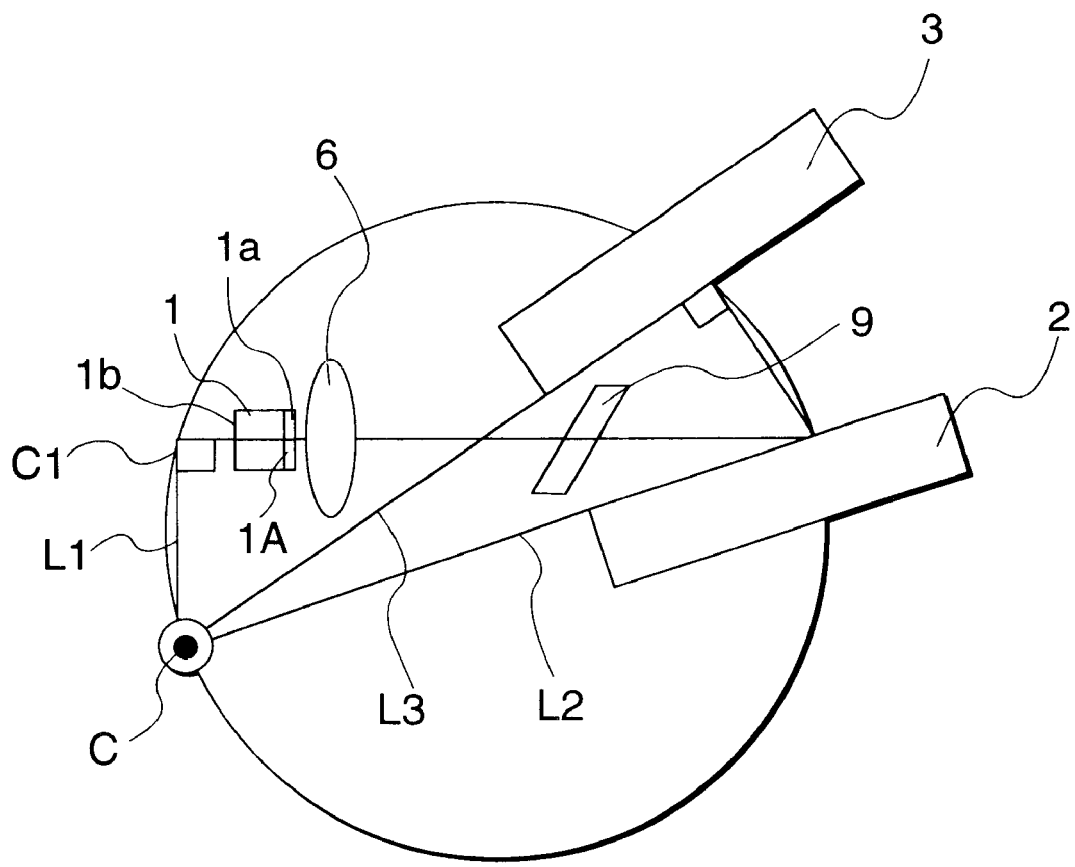
FIG. 13 shows a setting of the rotation center position of a mirror 3 in the light source for an external cavity laser according to the third embodiment.

A rotation center position of the mirror 3 is preferably set to a position disclosed in "Novel geometry for single-mode scanning of tunable laser (Karen Liu and Michael G. Littman/March 1981/vol. 6 No. 3/Optics Letter sp.117–118)". Referring to FIG. 13, specific explanation of the above will be given. Supposing that all mediums of the lens 6, the beam splitter 9 and the semiconductor laser 1 are made of air, the lengths of the beam splitter 9 and the semiconductor laser 1 in the optical axis direction is converted. Then, a position of the facet of the semiconductor laser 1 at the increased reflection side with respect to the diffraction grating 2 is defined as an optical position C1 using the converted lengths. An intersection, where a line L1 passing through the optical position C1 intersects with a line L2 extended a diffracting surface of the diffraction grating 2, is defined as a point C. The mirror 3 is disposed so that a line extended a reflection surface of the mirror 3 passes through the point C and the rotation center position of the mirror 3 corresponds to the point C.

With this positional relationship, the external resonator type laser source according to the third embodiment achieves the continuous variation of wavelength without mode hopping.

Incidentally, the third embodiment may also be applied to the light source for an external cavity laser shown in FIG. 1.

Fourth Embodiment

Figure 4:
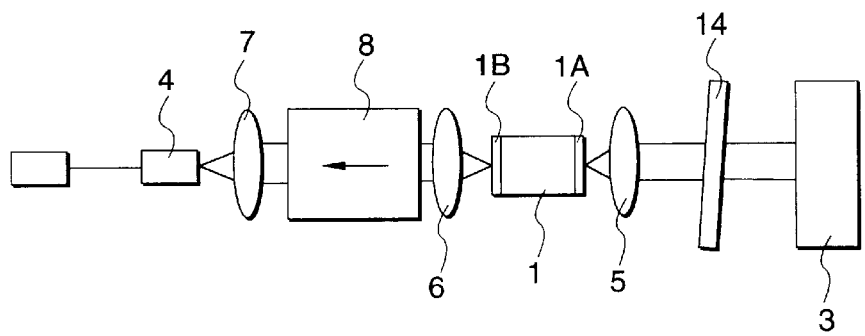
FIG. 4 is a constructional view showing a light source for an external cavity laser according to a fourth embodiment

In a fourth embodiment shown in FIG. 4, a band-pass filter 14 is used as an optical element for wavelength selection in the light source for an external cavity laser shown in FIG. 1. In this case, a corner reflector (corner cube mirror) may be used as the mirror 3 in order to facilitate alignment.

Fifth Embodiment

Figure 5:
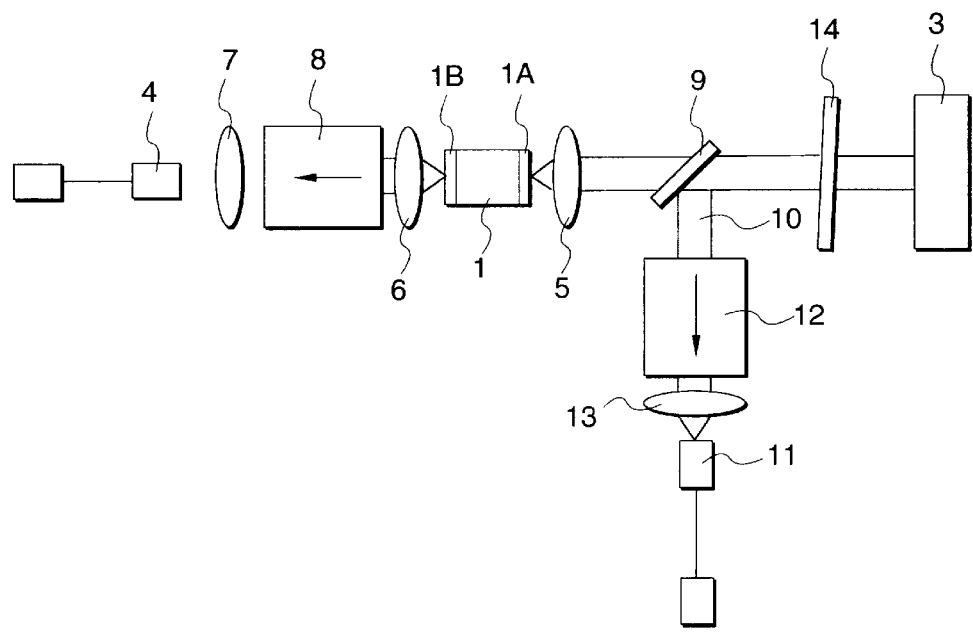
FIG. 5 is a constructional view showing a light source for an external cavity laser according to a fifth embodiment.

In a fifth embodiment shown in FIG. 5, the band-pass filter 14 is used as the optical element for wavelength selection in the light source for an external cavity laser shown in FIG. 2. In this case, a corner reflector (corner cube mirror) may be used as the mirror 3 in order to facilitate alignment.

Sixth Embodiment

Figure 6:
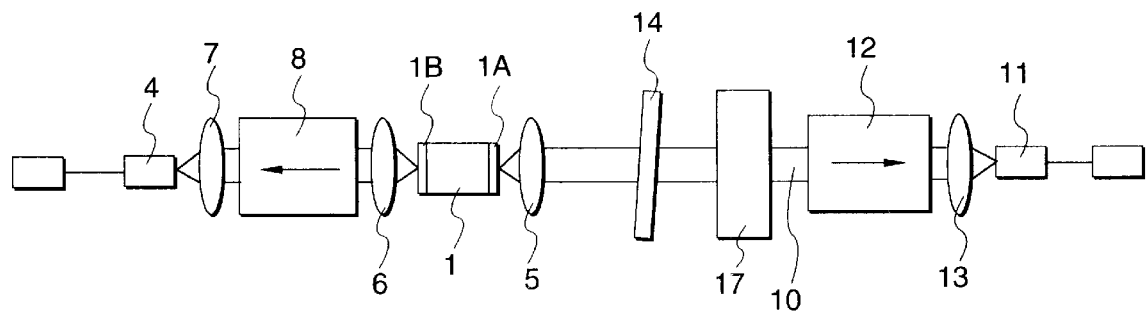
FIG. 6 is a constructional view showing a light source for an external cavity laser according to a sixth embodiment.

In a sixth embodiment of FIG. 6, the band-pass filter 14 is used as the optical element for wavelength selection in the light source for an external cavity laser shown in FIG. 2, and in place of using the beam splitter 9 shown in FIGS. 2 and 5, the mirror 3 is made of a partially reflecting mirror 17 to converge a part of light returning to the semiconductor laser 1 into an optical fiber 11.

Seventh Embodiment

Figure 7:
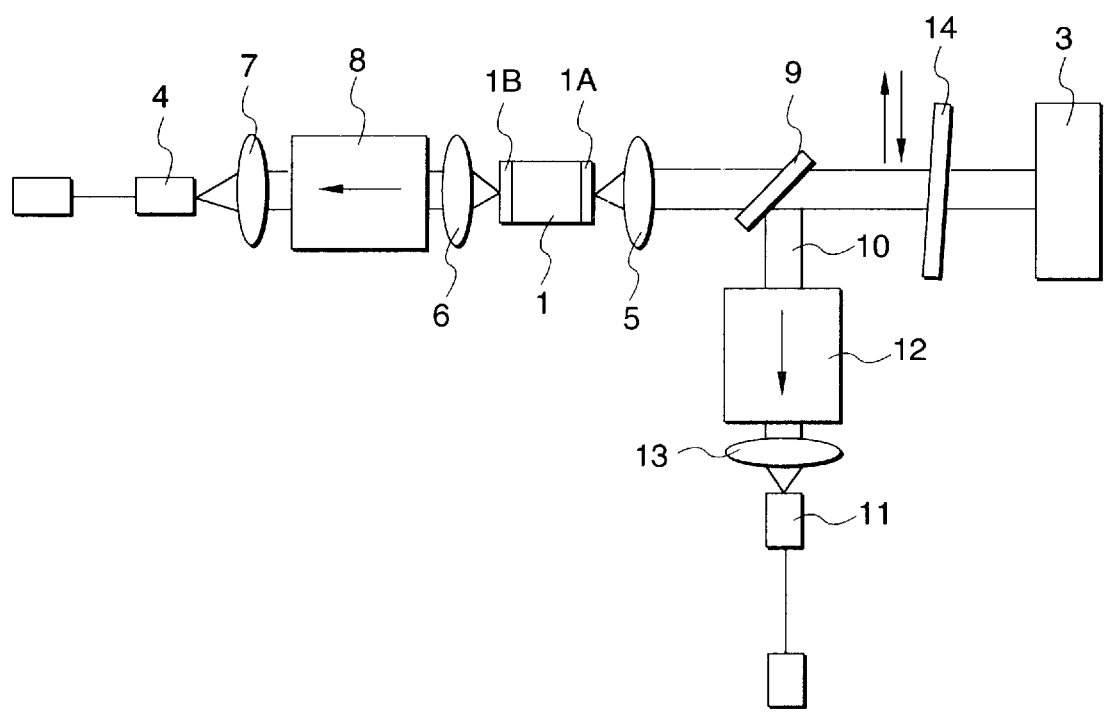
FIG. 7 is a constructional view showing a light source for an external cavity laser according to a seventh embodiment.

In a seventh embodiment shown in FIG. 7, a variable band-pass filter, with which film thickness is varied in a continuous manner, is used as the band-pass filter 14 in the light source for an external cavity laser shown in FIG. 5, and the variable band-pass filter 14 has a slide mechanism (indicated by an arrow) to be able to change the selected wavelength.

This embodiment is also applicable to the light source for an external cavity lasers shown in FIGS. 4 and 6.

Accordin to the first aspect of the invention, since an increased reflection coating, provided with prescribed reflectivity characteristics, is applied onto the end face of the semiconductor laser on which the antireflection coating is not applied, even if the efficiency of feedback to the semiconductor laser is lowered by the passage via the diffraction grating twice in the round-trip, a stable light source can be provided with which unstable emission, such as multi-mode emission and mode hopping, is restrained.

In the invention, a pure single-wavelength light beam without spontaneous emission components can be obtained, and since an increased reflection coating is applied, a light source of stable emission conditions can be obtained even if the efficiency of feedback to the semiconductor laser is lowered to or below the level of the first aspect of the invention due to the passage of light through the beam splitter and via the diffraction grating twice in the round-trip.

In the invention, the merit of being able to select an arbitrary wavelength freely is provided by the rotation mechanism that changes the selected wavelength by the changing of the angle of the mirror.

In the invention, a pure single-wavelength light beam without spontaneous emission components can be obtained, and since an increased reflection coating is applied, a light source of stable emission conditions can be obtained even if the efficiency of feedback to the semiconductor laser is lowered to or below the first aspect of the invention due to the passage of light through the beam splitter and the band-pass filter twice in the round-trip.

In the invention, a pure single-wavelength light without spontaneous emission components can be obtained, and since an increased reflection coating is applied, a light source of stable emission conditions can be obtained even if the efficiency of feedback to the semiconductor laser is lowered.

In the invention, the merit of being able to select an arbitrary wavelength freely is provided by the slide mechanism that changes the selected wavelength by the change of the position of a variable band-pass filter, with which the film thickness is varied in a continuous manner.

What is claimed is:

1. A light source for an external cavity laser comprising:

a semiconductor laser including a first facet with an antireflection coating, and a second facet with an increased reflection coating defining a predetermined reflectivity, the semiconductor laser for emitting two light beams from the first facet and the second facet;

a first lens for converting the light beam emitted from the first facet into a first parallel light beam;

a second lens for converting the light beam emitted from the second facet into a second parallel light beam;

a wavelength selection optical element for selecting a wavelength of the first parallel light beam and emitting a parallel light beam having the wavelength selected; and a mirror reflecting back the first parallel light beam emitted from the wavelength selection optical element so that the wavelength of that parallel light beam is selected twice in the wavelength selection optical element;

wherein the parallel light beam selected twice is converged by the first lens to be fed back to the semiconductor laser; and the light beam emitted from the second facet is converged by the second lens to be output to a first optical fiber.

2. The light source according to claim 1, wherein the wavelength selection optical element includes a diffraction grating.

3. The light source according to claim 1, further comprising a beam splitter positioned between the semiconductor laser and the wavelength selection optical element, wherein the beam splitter takes out a part of the first parallel light beam fed back from the wavelength selection optical element to the semiconductor laser; and the parallel light beam taken out by the beam splitter is converged to be output to a second optical fiber.

4. The light source according to claim 1, further comprising a rotation mechanism for changing an angle of the mirror in relation to the wavelength selection optical element, wherein the wavelength of the parallel light beam selected in the wavelength selection optical element is changed according to the angle of the mirror.

5. The light source according to claim 1, wherein the wavelength selection optical element includes a band-pass filter.

6. The light source according to claim 5, wherein the mirror reflects a part of the first parallel light beam; and the part of the first parallel light fed back to the semiconductor laser is converged to be output to an optical fiber.

7. The light source according to claim 5, wherein the band-pass filter is a variable band-pass filter comprising a film with a thickness that varies across the filter in a continuous manner;

a slide mechanism is provided to vary a position of the variable band-pass filter; and a wavelength selected by the variable band-pass filter is changed according to the position of the variable band-pass filter.

* * * * *